United States Patent [19]
Onodera et al.

[11] Patent Number: 4,777,517
[45] Date of Patent: Oct. 11, 1988

[54] COMPOUND SEMICONDUCTOR INTEGRATED CIRCUIT DEVICE

[75] Inventors: Tsukasa Onodera; Haruo Kawata; Toshiro Futatsugi, all of Atsugi, Japan

[73] Assignee: Fujitsu Limited, Kawasaki, Japan

[21] Appl. No.: 801,782

[22] Filed: Nov. 26, 1985

[30] Foreign Application Priority Data

Nov. 29, 1984 [JP] Japan ................................. 59-252512
Nov. 29, 1984 [JP] Japan ................................. 59-252513

[51] Int. Cl.$^4$ ..................... H01L 29/04; H01L 29/80
[52] U.S. Cl. ........................................ 357/22; 357/60; 357/26
[58] Field of Search ................. 357/60, 22, 61, 23.2, 357/41, 26; 148/DIG. 115

[56] References Cited

U.S. PATENT DOCUMENTS

| | | | |
|---|---|---|---|
| 3,603,848 | 9/1971 | Sato et al. | 357/60 |
| 3,612,960 | 10/1971 | Takeishi et al. | 357/60 |
| 4,268,848 | 5/1981 | Casey et al. | 357/60 |

FOREIGN PATENT DOCUMENTS

| | | |
|---|---|---|
| 58-164269 | 9/1983 | Japan . |
| 59-79577 | 5/1984 | Japan . |
| 59-165467 | 9/1984 | Japan . |

OTHER PUBLICATIONS

Ghandi, VLSI Fabrication Principles (Wiley-Interscience, NY, 1983), pp. 10-14.
IEEE Transactions on Electron Devices, ED-31 (1984) Oct., No. 10, "Piezoelectric Effects in GaAs FET's and Their Role in Orientation-Dependent Device Characteristics," pp. 1377-1380.
Electronics Letters, vol. 15, No. 12, (1979) "CdTe/-Langmuir-Film MIS Structures", pp. 335-336.
Solid-State Electronics, 1975, vol. 18, "Ion-Implanted Microwave Field-Effect Transistors in GaAs," pp. 349-353.

*Primary Examiner*—William D. Larkins
*Attorney, Agent, or Firm*—Staas & Halsey

[57] ABSTRACT

An IC device comprising a plurality of FET's using a compound semiconductor, more specifically, a zinc-blende type semiconductor substrate, having a surface of a (111) plane. By use of this plane, differences of characteristics of the FET's depending on directions along which gates of the FET's are arranged when the gate length is made shorter are prevented, allowing arrangement of gates of the FET's in different directions, particularly perpendicular to each other, with making the gate length shorter to miniaturize and densify the device.

10 Claims, 13 Drawing Sheets

COMPOUND SEMICONDUCTOR INTEGRATED CIRCUIT DEVICE

BACKGROUND OF THE INVENTION

1. Field of the Invention

The present invention relates to a compound semiconductor device, more specifically, a semiconductor device comprising a plurality of field effect transistors (FET's) arranged in any direction or different directions, e.g., perpendicular to each other, in and on a compound semiconductor substrate.

2. Description of the Related Art

One of the more prominent developments in recent years has been silicon semiconductor devices. These silicon devices, however, have limits as to their operating speed and so research has begun on compound semiconductor devices to take their place. Compound semiconductors such as gallium arsenide (GaAs) feature remarkably larger mobility of carriers compared with silicon and thus offer increased operating speed. Transistors for which compound semiconductors are used include mainly FET's, particularly, Schottky barrier or metal-semiconductor FET's (MESFET's), since fabrication thereof is simple. Efforts are directed to make more practical integrated circuit (IC) devices utilizing the features of compound semiconductors.

A MESFET includes source and drain regions in a semiconductor substrate, in this case, a compound semiconductor substrate, for example, a GaAs substrate, a channel region in the substrate between the source and drain regions, and a gate electrode of a metal on the channel region, the metal of the gate electrode making Schottky contact with the semiconductor of the channel region.

IC devices may be composed of MESFET's, as mentioned above, and miniaturized to increase speed and integration. However, if the gate length of the FET's is made shorter for miniaturization, the deviations from the desired values of the characteristics of the FET's, such as the gate threshold voltage (Vth), and transconductance $g_m$ or K-value, i.e., a voltage-independent factor of the transconductance $[K=\epsilon\mu W_g/2aL_g$, where a is a thickness of a channel layer, $\epsilon$ a permittivity of a channel layer, $\mu$ a mobility of carriers, $W_g$ a gate width, and $L_g$ a gate length]become larger and the characteristics of the FET's are changed in different manners depending on the crystallographic axis directions along which the gates are arranged. Conventional compound semiconductor devices such as GaAs devices generally use the (100) plane as the surface of the substrate. The gate threshold voltage of a MESFET having a gate along the [011]axis on the (100) plane changes greatly in the minus direction when the gate length is reduced below 2 μm, while that of a MESFET having a gate along the [01$\bar{1}$] axis on the (100) plane changes slightly in the plus direction. Thus, IC devices with MESFET's whose gates are arranged in two such directions cannot provide a desired circuit operation if the gate lengths of the MESFET's deviate from the design values due to variations in the fabrication process. Therefore, conventional IC devices comprising MESFET's are fabricated by arranging gates of the MESFET's in only one direction. When attempting to arrange the output lines of the MESFET's in two or more different directions, such as in an X- and Y-address decoder of a memory circuit, both the design and fabrication process become complicated and miniaturization and densification of the IC device become difficult.

Turning back to the changes in characteristics, such as the gate threshold voltage of an FET, from desired values when the gate length is made shorter, i.e., the so-called "short channel" effect, it is important to note the flow of electrons from highly doped source and drain regions into a channel region and the effect of piezoelectric polarization in a semiconductor substrate. Deviations in characteristics of an FET by piezoelectric polarization are caused by an insulating layer, a gate electrode, and the like formed over a compound semiconductor substrate, which induce stress on the compound semiconductor substrate, changing the distribution of carriers in the channel region formed in the compound semiconductor substrate. As a result, the depth of a depletion layer of the channel region and thus the gate threshold voltage are changed. The direction of the change of the gate threshold voltage, plus or minus, depends on the polarity of the piezoelectric polarization determined by the stress direction and crystallographic axis direction. [See, for example, P. M. Asbeck et al.; IEEE transactions on Electron Devices, Vol. ED-31, No. 10, Oct. 1984, pp. 1377-1380] The K-value also varies with a change of the depth of the depletion layer of the channel region.

SUMMARY OF THE INVENTION

An object of the invention is to provide a compound semiconductor IC device including a plurality of FET's and having characteristics which do not depend on the direction or directions of a gate or gates of the FET's.

Another object of the invention is to provide a compound semiconductor IC device including a plurality of FET's whose gates are arranged in different directions and which have uniform and desired characteristics if the device is miniaturized or the gate length of the FET's is shortened.

The above objects are attained by using a zincblende type compound semiconductor having a surface of the (111) plane as a substrate of the IC device.

We found that characteristics of FET's formed in and on a zincblende type compound semiconductor substrate having a surface of the (111) plane substantially do not depend on a direction or directions of a gate or gates of the FET's on the (111) surface. The invention was made based on this fact.

Thus, in a feature of the invention, a semiconductor device may be composed of FET's whose gates are arranged in any direction or different directions, particularly perpendicular to each other, without risk of variation of the characteristics of the FET's depending on the direction or directions of the gates thereof.

Further, we also found that if a gate electrode and an insulating layer formed over a compound semiconductor substrate are made in such a manner that they induce piezoelectric polarization in the substrate, which reduces the leakage current through the substrate, the desired characteristics of FET's with a shortened gate length are attained, that is, deviation of the characteristics from the desired values may be prevented.

Thus, in accordance with another feature of the invention, there is provided a semiconductor IC device including a plurality of FET's in and on a zincblende type semiconductor substrate having a surface of the (111) plane, in which a gate electrode and an insulating layer formed on the substrate are made in such a manner that they induce piezoelectric polarization in the substrate which reduces the leakage current through the substrate.

When the substrate has a surface of the (111)A plane and the FET's are the n-channel type, a gate electrode and an insulating layer are selected and made so as to induce tensile stress to the channel region in the substrate, whereby the concentration of the n-type minority carriers is reduced.

When the substrate has a surface of the (111)A plane and the FET's are the p-channel type, a gate electrode and an insulating layer are selected and made so as to induce compressive stress to the channel region in the substrate, whereby the concentration of n-type minority carriers is reduced.

When the substrate has a surface of the (111)B plane and the FET's are the n-channel type, a gate electrode and an insulating layer are selected and made so as to induce compressive stress to the channel region in the substrate, whereby the concentration of n-type majority carriers is reduced.

When the substrate has a surface of the (111)B plane and the FET's are the p-channel type, a gate electrode and a insulating layer are selected and made so as to induce tensile stress to the channel region in the substrate, whereby the concentration of p-type minority carriers is reduced.

When the substrate has a surface of (111)A and the FET's are the complementary n-channel and p-channel type, gate electrodes and insulating layers are selected and made so as to induce tensile stress to a part of the substrate including the n-type channel region and compressive stress to a part of the substrate including the p-type channel region respectively, whereby the concentrations of the n-type and p-type majority carriers in the n-type and p-type channel regions respectively are reduced.

When the substrate has a surface of the (111)B plane and the FET's are the complementary n-channel and p-channel type, gate electrodes and insulating layers are selected and made so as to induce compressive stress to a part of the substrate including the n-type channel region and tensile stress to a part of the substrate including the p-type channel region, respectively, whereby the concentrations of the n-type and p-type majority carriers in the n-type and p-type channel regions respectively are reduced.

Here, the expression (111)A designates a (111) plane where atoms of the II or III group of the Periodic Table are exposed and the expression (111)B designates a (111) plane where atoms of the V or VI group of the Periodic Table are exposed. Generally speaking, an insulating layer of silicon dioxide ($SiO_2$) induces tensile stress to a compound semiconductor substrate such as a GaAs substrate and an insulating layer of silicone nitride ($SiN_x$) induces compressive stress to a compound semiconductor substrate such as a GaAs substrate.

Zincblende type III-V compound semiconductors include GaAs, InP, InAs, InSb, GaP, GaSb, AlSb, BN, BP, AlAs, InGaAsP, AlGaAsP, InGaAsSb, AlGaAsP, AlGaInP and AlGaAsSb. Zincblende type II-VI compound semiconductors include CaS, CdSe, CdTe, ZnTe, ZnSe, ZnS, HgSe, HgTe and HgS.

DESCRIPTION OF THE PREFERRED EMBODIMENTS

In order to fully understand the invention, descriptions of the prior art are made first.

Figure 1:
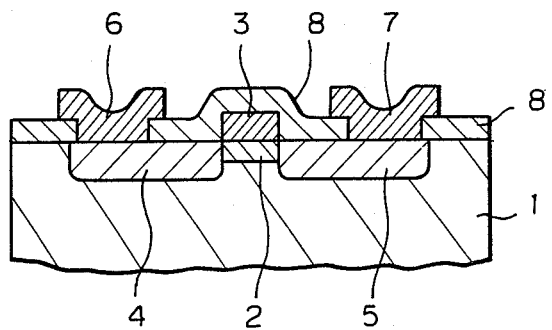
FIG. 1 is a cross-sectional view of a MESFET.

FIG. 1 illustrates a typical GaAs MESFET, in which reference numeral 1 denotes a semi-insulating GaAs substrate, 2 an n-type channel region, 3 a Schottky gate electrode, 4 an n+-type source region, 5 an n+-type drain region, 6 a source electrode, 7 a drain electrode, and 8 an insulating layer of, e.g., $SiO_2$. In the prior art, the GaAs substrate 1 having a surface of the (100) plane is used.

Figure 2:
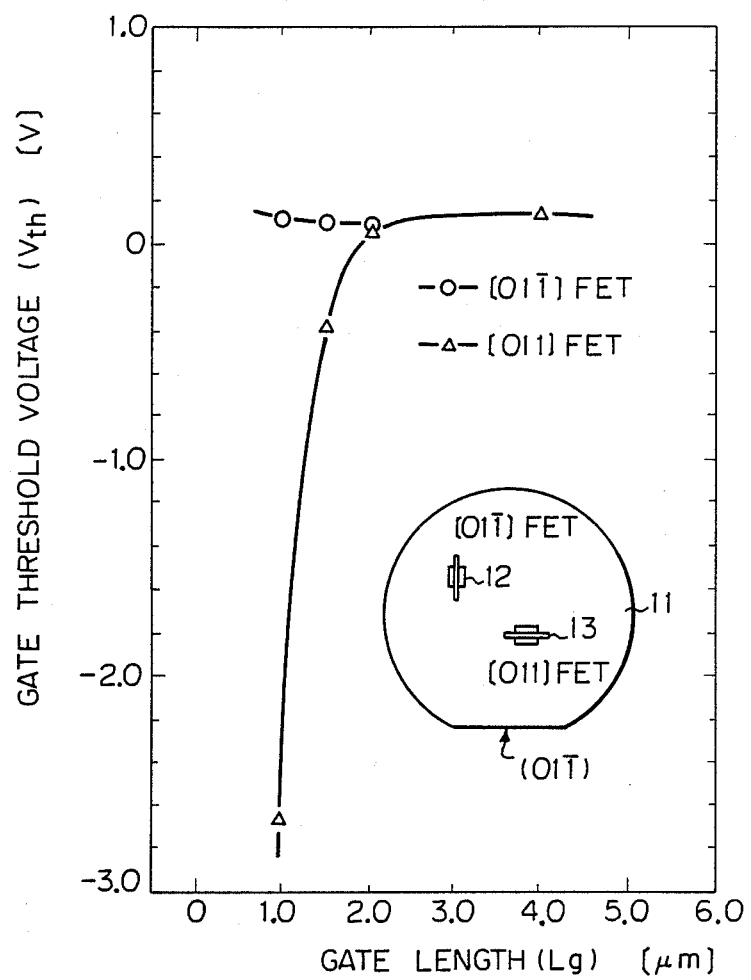
FIG. 2 is a graph of the gate threshold voltage in relation to gate length in a prior art FET.

FIG. 2 shows changes of the gate threshold voltages of MESFET's in which the gate width direction is arranged along the crystallographical axes [011] and [01$\bar{1}$], respectively, on a (100) plane of a single crystal GaAs substrate 11, the axes [011] and [01$\bar{1}$] being perpendicular to each other. As shown in FIG. 2, when the gate length is reduced below about 2 μm, the gate threshold voltage of an FET 12 whose gate width direction is arranged along the [01$\bar{1}$] axis is changed slightly in the plus direction, while that of an FET 13 whose gate width direction is arranged along the [011] axis is changed greatly in the minus direction. Therefore, in an IC device including a plurality of FET's in the prior art, the gates of the FET's are formed in one direction to avoid deviation of the characteristics of an FET such as the gate threshold voltage.

Figure 3A:
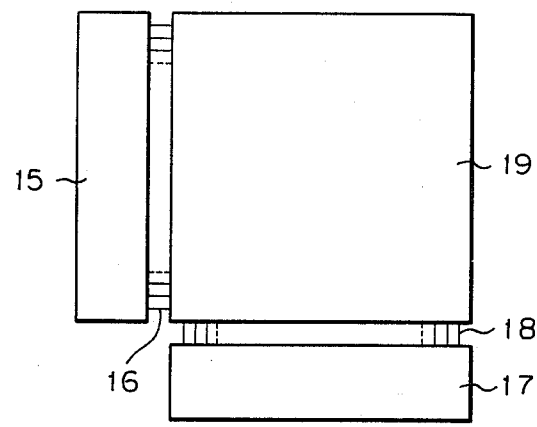
FIG. 3A is a plan view of a memory device including X- and Y-decoders.
Figure 3B:
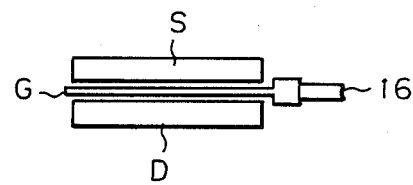
FIG. 3B is a plan view of a MESFET in an X-decoder in FIG. 3A.
Figure 3C:
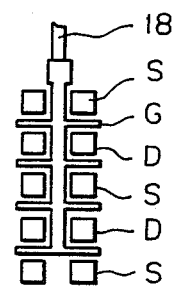
FIG. 3C is a plan view of a MESFET in a Y-decoder in FIG. 3A.

FIGS. 3A, 3B, and 3C illustrate a memory device including X- and Y-address decoder circuits composed of MESFET's whose gate width directions are arranged in the same direction.

As shown in FIG. 3A, output lines 16 of an X-decoder 15 and output lines 18 of a Y-decoder 17 are connected to a memory cell matrix 19, and the output lines 16 and 18 are arranged perpendicular to each other. As shown in FIG. 3B, X-decoder 15 may have patterns in which the directions of the output lines 16 and the gate width of MESFET's are the same, for example, along the [01$\bar{1}$] axis, allowing the elimination of excess patterns. In FIGS. 3B and 3C, reference G denotes a gate, S a source, and D a drain. However, if the direction of the gate width of the FET's of the Y-decoder 17 coincides with that of the X-decoder 15, along the [01$\bar{1}$] axis, the direction of the output line 18 is perpendicular to the former. Thus, a complicated pattern as in FIG. 3C is necessary for FET's in the Y-decoder 17, in which the gate G of the FET's is made in the form of a comb and a number of sources S and drains D are formed between the branches of the comb, whereby the necessary width of the gate of the FET's corresponding to the width of FET's of the X-decoder 15, is obtained. Such a complicated pattern makes miniaturization and densification of the device difficult in both design and fabrication.

The inventors investigated the relations between the material and thickness of an insulating layer and the stress formed in a compound semiconductor substrate, between crystallographical planes or axes of a compound semiconductor substrate and piezoelectric polarization due to the stress, between the piezoelectric polarization and the gate threshold voltage and K-value of an FET, and the like and found that the deviation of characteristics from desired values of FET's formed in and on a compound semiconductor substrate may be eliminated or reduced by using the (111) plane as the surface of the substrate, even if the gate length is shortened below about 2 μm and the gates of FET's are formed in different directions.

Figure 4:
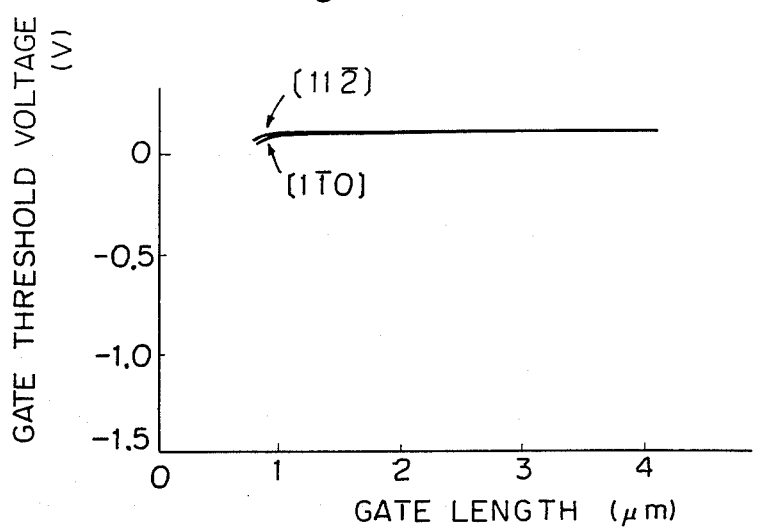
FIGS. 4 and 5 are graphs of the gate threshold voltage and K-value in relation to the gate length in an FET according to the invention.
Figure 5:
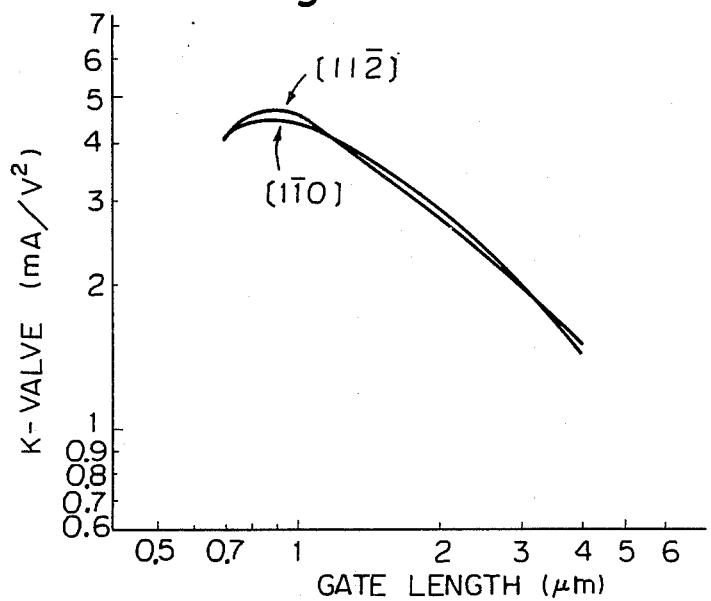

FIGS. 4 and 5 show gate threshold voltages and K-values of FET's with $SiO_2$ encapsulation whose gates are formed so that the gate widths are along [1$\bar{1}$0] and [11$\bar{2}$] axes on a (111)A plane of a GaAs substrate. As shown in FIGS. 4 and 5, the gate threshold voltages and K-values of the two kinds of FET's arranged in perpendicular directions are substantially the same even if the gate lengths of the FET's are made shorter than about 2 μm.

Figure 6:
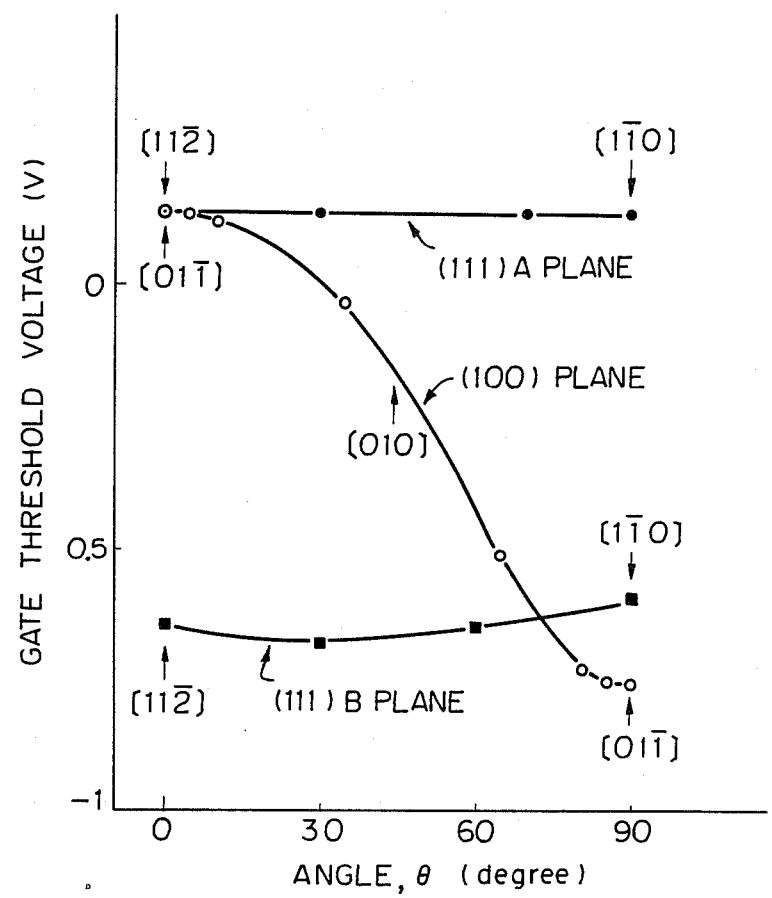
FIG. 6 shows gate threshold voltages of FET's having various gate directions in the prior art and in accordance with the invention.

FIG. 6 shows gate threshold voltages of $SiO_2$-encapsulated FET's formed in and on (100), (111)A, and (111)B GaAs substrates when the directions of of the FET's are varied. It is seen in FIG. 6 that the threshold voltage of an FET formed in and on the (100) GaAs substrate remarkably varies with the direction in which the gate of the FET is formed, while the threshold voltages of FET's formed in and on the (111)A and (111)B GaAs substrates are not substantially changed with the direction in which the gate of the FET's are formed. In FIG. 6, the angle of the abscissa is defined by an angle formed between the gate width direction and the [01$\bar{1}$] axis for the (100) plane or the [11$\bar{2}$] axis for the (111)A and (111)B planes.

Thus, by using the (111) plane of a compound semiconductor substrate, more specifically, a zincblende type compound semiconductor substrate, a gate or gates of FET's can be formed in any direction on the (111) plane while uniform values of characteristics of the FETs are obtained. This is the basic advantage of the invention.

In an important embodiment of the invention, gates of FET's may be arranged in different directions, particularly, in directions perpendicular to each other without worrying about variation of characteristics of the FET's, because the characteristics of the FET's do not depend on the directions of the gates when the substrate in and on which the FET's are formed has a surface of the (111) plane. This allows patterns of various IC devices, e.g., X-Y decoder circuits, to be simplified.

Figure 7A:
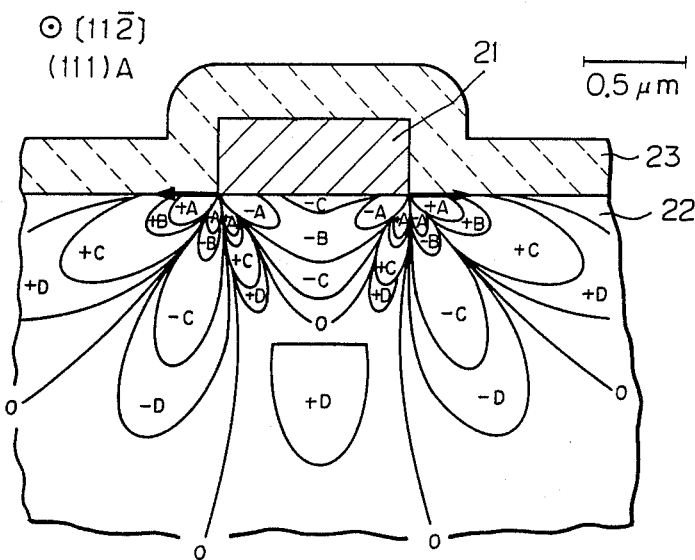
FIGS. 7A and 7B illustrate piezoelectric polarization in two portions of a (111) GaAs substrate for FET's whose gates are arranged along the [11$\bar{2}$] and [1$\bar{1}$0] axes of the substrate when an insulating layer of $SiO_2$ is formed over the substrate.
Figure 7B:
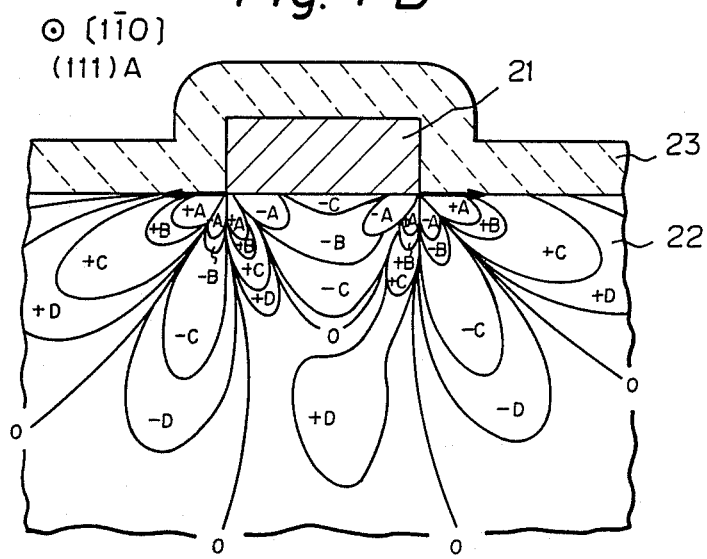

FIGS. 7A and 7B illustrate distributions of a piezoelectric charge when FET's are made by forming a gate electrode 21 of tungsten silicide (WSi) on a (111)A plane of a GaAs substrate 22, the directions of gate widths of the FET's being along the [11$\bar{2}$] axis in FIG. 7A and along the [1$\bar{1}$0] axis in FIG. 7B, and then forming an insulating layer 23 of $SiO_2$ over the gate electrode and the substrate. In FIGS. 7A and 7B, reference "A" denotes the concentration of carriers of $1 \times 10^{16}$ cm$^{-3}$ or more, "B" $5 \times 10^{15}$ to $1 \times 10^{16}$ cm$^{-3}$, "C" $1 \times 10^{15}$ to $5 \times 10^{15}$, and "D" $5 \times 10^{14}$ to $1 \times 10^{15}$ cm$^{-3}$, and references "+" (plus) and "−" (minus) denote of the charges A to D are plus and minus charges, respectively.

The two distributions of piezoelectric charge in FIGS. 7A and 7B are extremely similar to each other, though the directions of the [11$\bar{2}$] and [1$\bar{1}$0] axes are perpendicular to each other. Similar results are obtained when two other directions perpendicular to each other are selected in place of the directions of the [11$\bar{2}$] and [1$\bar{1}$0] axes. Further, completely the same results are obtained except that the signs of the charges are inverted when the (111)B plane of a GaAs substrate is used in place of the (111)A plane.

Thus, the characteristics of piezoelectric polarization are very similar between any two directions perpendicular to each other on the (111) plane. Between any two directions not perpendicular to each other, the difference in piezoelectric charge distribution is very small. These characteristics of the (111) plane of a zincblende type compound semiconductor allow the prevention of different characteristics of FET's having gates formed in different directions even if the length of a channel or a gate is made shorter than 2 μm. Uniform characteristics of FET's irrespective to directions of gates are seen in FIGS. 4 to 6.

In a preferred embodiment of the invention, an insulating layer formed over a substrate is selected so that the insulating layer with a gate electrode induces a moderate piezoelectric charge effectively reducing the leakage current from the substrate under the channel region of an FET. This allows desired values of characteristics of the FET, that is, prevention, for example, of change of a gate threshold voltage and reduction of a K-value when the length of the gate is made shorter, e.g., as short as 2 μm or less.

To examine the effects of an insulating layer formed over a compound semiconductor substrate having a surface of the (111) plane, the following FET's were fabricated and the characteristics of the FET's were determined.

Figure 8:
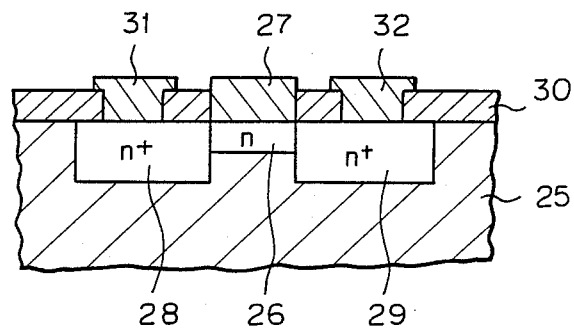
FIG. 8 is a cross-sectional view of a MESFET in a preferred embodiment of the invention.

Referring to FIG. 8, in a semi-insulating GaAs substrate 25 having a surface of the (111)B plane, an n-type channel region 26 is formed by implanting, e.g., silicon ions at an energy of 59 keV and a dose of $1.0 \times 10^{12}$ cm$^{-2}$, followed by carrying out heat treatment at 850° C. for 15 minutes for activation.

A gate electrode 27 of, e.g., tungsten silicide ($W_5Si_3$) having a thickness of about 400 nm is formed on the channel region 26.

N+-type source and drain regions 28 and 29 are formed by implanting Si ions into the substrate 25 at 175 keV and $1.7 \times 10^{13}$ cm$^{-2}$ using the gate electrode 27 as a mask, followed by carrying out heat treatment at 750° C. for 10 minutes for activation.

An insulating layer 30 of silicon nitride ($Si_3N_4$) having a thickness of about 300 nm is formed over the substrate 25 by, e.g., plasma chemical vapor deposition (PCVD).

Source and drain electrodes 31 and 32 having a thickness of about 300 nm are formed by opening windows in the insulating layer 30 on the source and drain regions 28 and 29, followed by depositing gold germanium/gold (AuGe/Au).

As reference samples, the insulating layer 30 is formed with $SiO_2$ and silicon nitride oxide ($SiN_xO_y$), respectively, in place of $SiO_3N_4$.

In further reference samples, the semi-insulating GaAs substrate 25 has a surface of the (111)A plane in place of the (111)B plane.

Figure 9A:
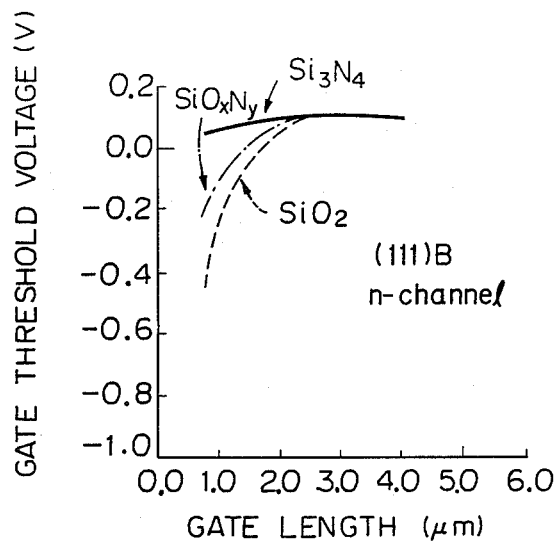
FIGS. 9A and 9B show characteristics of n-channel FET's when various insulating layers are used to cover the (111)B GaAs substrate.
Figure 9B:
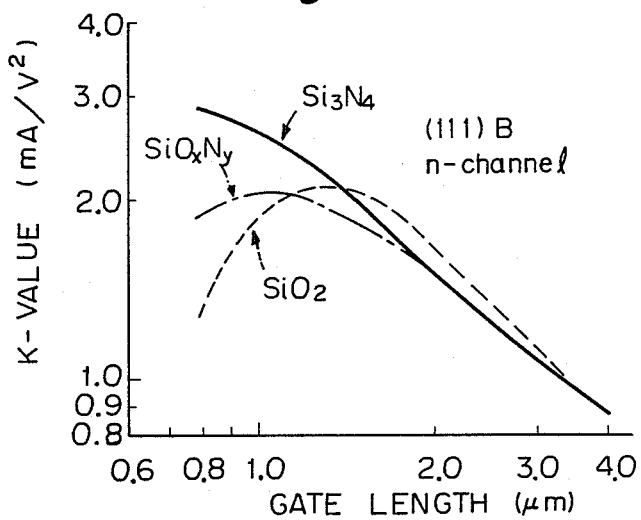
Figure 9C:
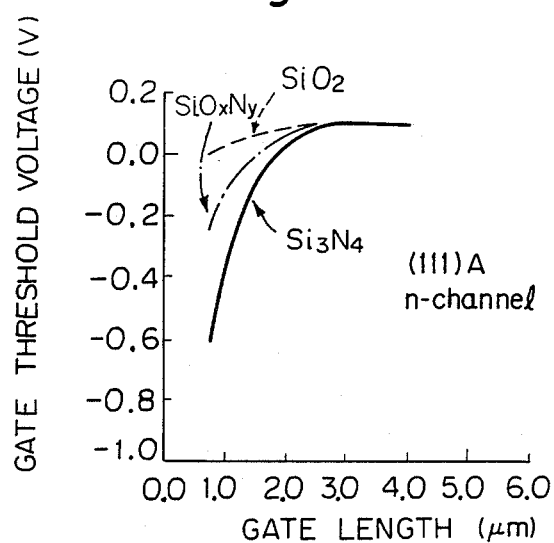
FIGS. 9C and 9D show characteristics of p-channel FET's when various insulating layers are used to cover the (111)A GaAs substrate.
Figure 9D:
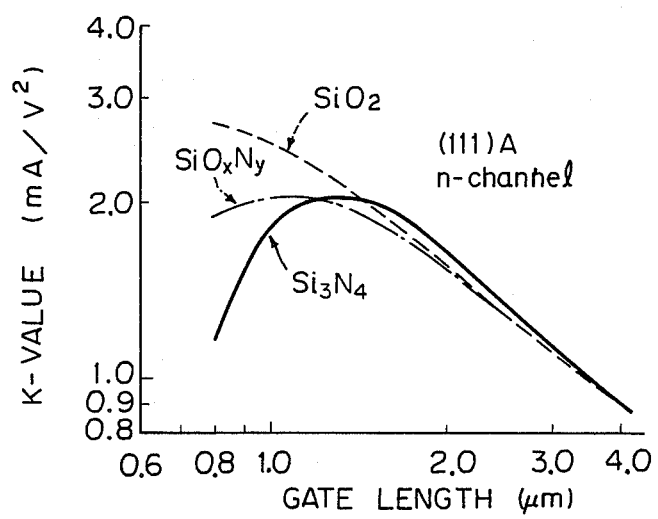

FIGS. 9A, 9B, 9C, and 9D show the characteristics of the above samples, n-channel type GaAs MESFET's, wherein FIGS. 9A and 9B relate to the (111)B plane, FIGS. 9C and 9D relate to the (111)A plane, FIGS. 9A and 9C show the gate threshold voltage in relation to the gate length, and FIGS. 9B and 9D show the K-value in relation to the gate length.

With respect to the (111)B plane, $Si_3N_4$ gives the minimum dependence of the gate threshold voltage on the gate length and the maximum K-value at a gate length below 1.5 μm and the lines of the gate threshold voltage and the K-value of $Si_3N_4$ extend almost straight. In comparison with this, $SiO_2$ results in the largest deviations and $SiN_xO_y$ gives intermediate deviations.

With respect to the (111)A plane, in contrast to the above, $SiO_2$ gives the best results with almost straight lines of the gate threshold voltage and the K-value, and $Si_3N_4$ results in the largest deviations.

Next, p-type channel MESFET's were fabricated by similar procedures to the above mentioned n-type channel MESFET's, except that the semi-insulating GaAs substrate 25 has a surface of the (111)A plane. A p-type channel region 26 is formed by implanting magnesium ($M_g$) at 50 keV and $3.0 \times 10^{12}$ cm$^{-2}$, followed by heat treatment at 1000° C. for 6 seconds. P+-type source and drain regions 28 and 29 are formed by implanting $M_g$ at 150 KeV and $6.0 \times 10^{13}$ cm$^{-2}$, followed by heat treatment 950° C. for 6 seconds. Source and drain electrodes 31 and 32 are made of gold zinc/gold (AuZn/Au).

Figure 10A:
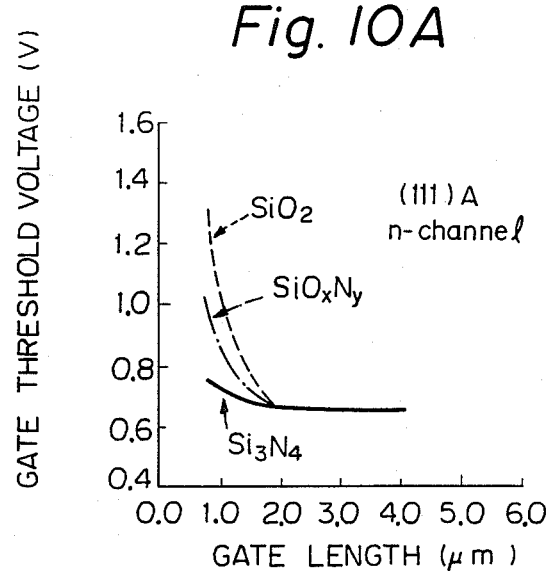
FIGS. 10A and 10B show characteristics of n-channel FET's when various insulating layers are used to cover the (111)B GaAs substrate.
Figure 10B:
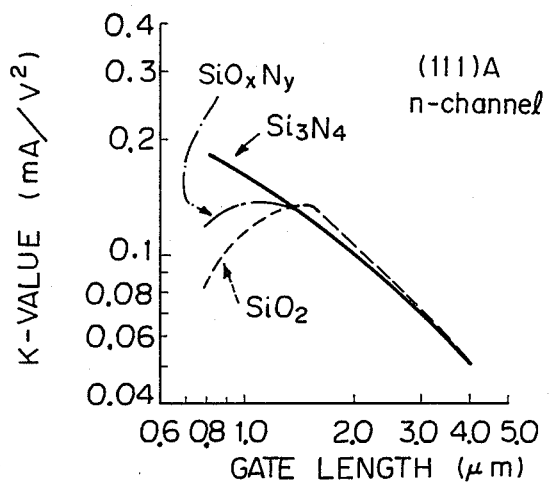
Figure 10C:
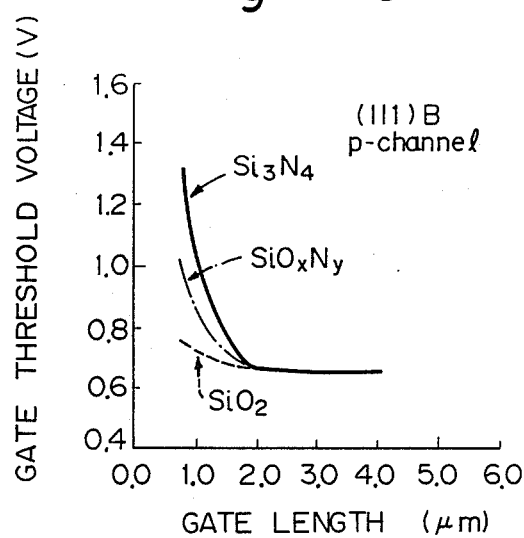
FIGS. 10C and 10D show characteristics of p-channel FET's when various insulating layers are used to cover the (111)B GaAs substrate.
Figure 10D:
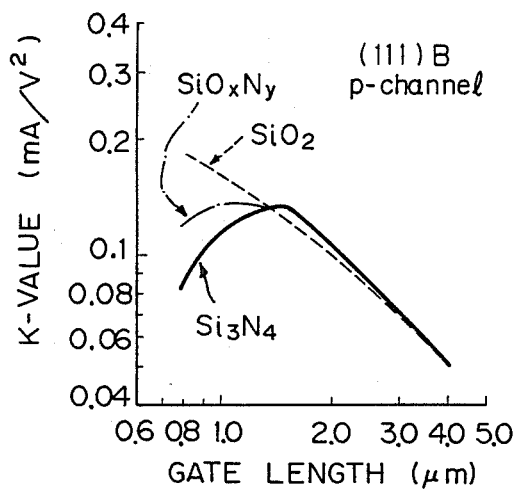

FIGS. 10A, 10B, 10C and 10D show the characteristics of the above samples, p-channel type GaAs MESFET's, wherein FIGS. 10A and 10B relate to the (111)A plane, FIGS. 10C and 10D relate to the (111)B plane, FIGS. 10A and 10C show the gate length dependence of the gate threshold voltage, and FIGS. 10B and 10D show the gate length dependence of the K-value.

With respect to the (111)A plane, $Si_3N_4$ gives the minimum dependence of the gate threshold voltage on the gate length and the maximum K-value at the gate length below 1.5 μm. In comparison with this, $SiO_2$ results in the largest deviations and $SiN_xO_y$ gives intermediate deviations.

With respect to the (111)B plane, in contrast to the above, $SiO_2$ gives the best results with almost straight lines of the gate threshold voltage and the K-value, and $Si_3N_4$ results in the largest deviations.

In the above samples, the insulating layer 30 of $Si_3N_4$ induces compressive stress to the GaAs substrate 25, causing a negative piezoelectric charge in the channel region of the FET in and on the (111)B substrate and a positive piezoelectric charge in the channel region of the FET in and on the (111)A substrate. The leakage current of n-channel FET's fabricated in and on the (111)B substrate is reduced by the negative piezoelectric charge, and that of p-channel FET's in and on the (111)A substrate is reduced by the positive piezoelectric charge. This leakage means the majority carries flow from the source to drain at the deep area of the substrate. Reducing the leakage current means preventing the change of gate threshold voltage. On the contrary, in n-channel FET's in and on the (111)A substrate or p-channel FET's in and on the (111)B substrate with $Si_3N_4$-encapsulation, the majority carrier density is increased by the piezoelectric charge, especially in the side deeper than desired channel region, which causes an increase in the leakage current through the substrate. Therefore, the characteristics of the FET's are changed.

An insulating layer of $SiO_2$ induces tensile stress to a GaAs substrate, including a piezoelectric charge with opposite signs to those in the case of $Si_3N_4$. Thus, an insulating layer of $SiO_2$ gives the best reults in p-channel FET's in and on the (111)B substrate and n-type channel FET's in and on the (111)A substrate.

An insulating layer of $SiN_xO_y$ has intermediate characteristics between those of $Si_3N_4$ and $SiO_2$, and does not induce piezoelectric polarization to a substrate where the values of x and y are optimized, in which case no effective increase or decrease of the concentration of carriers in a channel region is attained in a GaAs MESFET.

Figure 11:
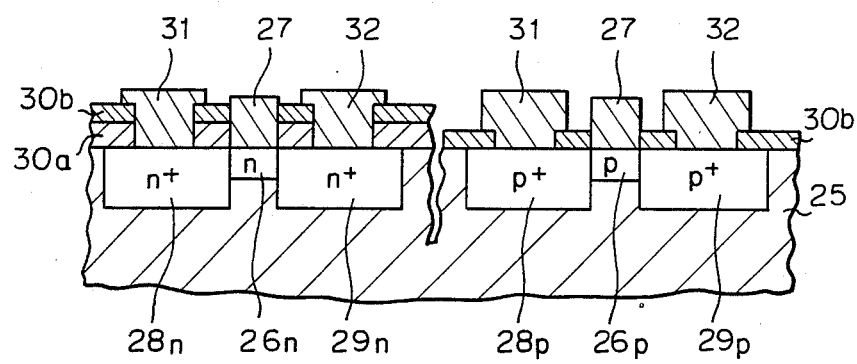
FIG. 11 is a cross-sectional view of MESFET's in a complementary circuit in a preferred embodiment of the invention.

FIG. 11 illustrates an IC device of a complementary circuit of MESFET's. This complementary circuit device is fabricated as desoribed below, for example. In a semi-insulating GaAs substrate 25 of the (111)B plane, as in the above n-type and p-type channel devices, n-type channel region 26n and p-type channel region 26p are formed. Then, gate electrodes 27n and 27p are formed and n-type source and drain regions 28n and 29n and p-type source and drain regions 28p and 29p are formed.

By PCVD, a first insulating layer 30a of $Si_3N_4$ having a thickness of 400 nm is formed selectively over the n-channel type element and then a second insulating layer 30b of $SiO_2$ having a thickness of 400 nm is formed entirely over the substrate 25, the gates electrodes 27n and 27p, and the first insulating layer 30a.

Source and drain electrodes 28n, 29n, 28p, and 29p are then formed.

In this complementary device, the insulating layer 30b of $SiO_2$ over the p-type channel region 26p induces tensile stress to the substrate 25. The insulating layer 30b of $SiO_2$ and the insulating layer 30a of $Si_3N_4$ over the n-type channel region 26n, as a whole, can be made to induce compressive stress to the substrate 25 by selecting the thickness of the layers 30b and 30a appropriately.

By these stresses, change of the gate threshold voltage and decrease of the K-value are prevented in both p- and n-channel type FET's, resulting in a complementary circuit having a reduced short-channel effect.

In the above complementary device, only the insulating layer over the n-channel type element is composed of double layers, but the arrangement of insulating layers over the n- and p-channel type elements is not limited thereto. For example, an insulating layer over a p-channel type element may be composed of double layers, or each of the insulating layers over the p- and n-channel type elements may be composed of selective insulating materials. Further, of course, a similar complementary device may be constructed using (111)A plane GaAs substrate.

Fabrication of an inverter comprising MESFET's of the E (enhancement) mode and D (depletion) mode, an example of an IC device according to the invention, is described below with reference to FIGS. 12A to 12D.

Figure 12A:
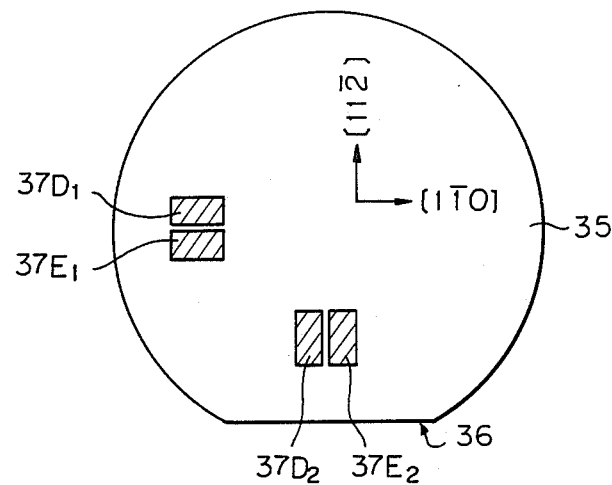
FIGS. 12A to 12D are plan views of an inverter device in some main steps of fabrication thereof.

Referring to FIG. 12A, a GaAs substrate 35 has a top main surface of the (111)B plane and a cut-off plane (orientation flat) 36 of the $(11\bar{2})$ plane. Alternatively, the cut-off plane 36 may be the $(1\bar{1}0)$ plane. As the $(1\bar{1}0)$ plane is one of the cleavage planes, the easiest breakage planes, the two directions of the $[1\bar{1}0]$ and $[11\bar{2}]$ axes, i.e., an axis in parallel with the cleavage plane and an axis perpendicular to the cleavage plane, are a preferable combination of directions perpendicular to each other along which gates of FET's are arranged, facilitating dicing or chip production.

Silicon (Si) ions are implanted into the substrate 35 to form n-type channel regions 37 as below: D-mode channel regions $37D_1$ and $37D_2$ at an energy of 59 keV and a dose of $1.7 \times 10^{12}$ cm$^{-2}$; E-mode channel regions $37E_1$ and $37E_2$ at 59 keV and $0.9 \times 10^{12}$ cm$^{-2}$. After ion implantation, a protective layer (not shown in the figure) of, e.g., aluminum nitride (AlN) is formed on the substrate 35 and heat treatment is carried out at 850° C. for 15 minutes for activation.

Figure 12B:
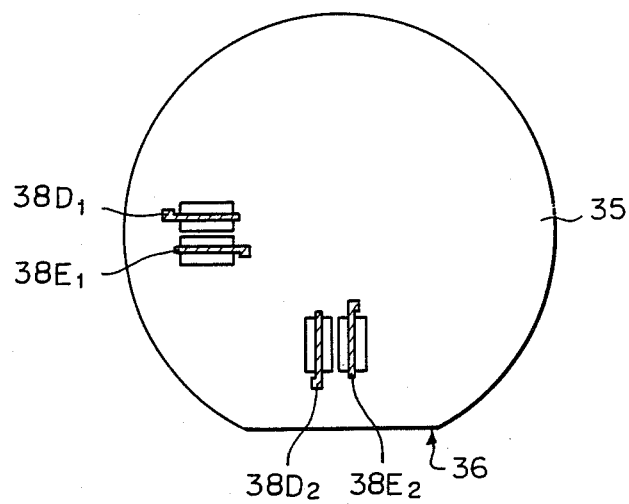

Referring to FIG. 12B, gate electrodes $38D_1$ and $38E_1$, the widths of which are along the $1\bar{1}0$ axis, and gate electrodes $38D_2$ and $38E_2$, the widths of which are along $11\bar{2}$, are formed by depositing, e.g., W$_5$Si$_3$ in a thickness of about 400 nm by sputtering, etc., followed by patterning. In this case, the gate length is about 1 μm.

Figure 12C:
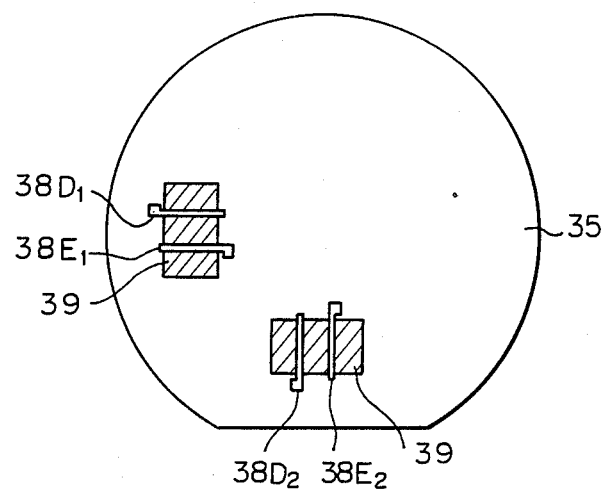

Referring to FIG. 12C, n$^+$-type source and drain regions 39 are formed by implanting Si ions at 175 keV and $1.7 \times 10^{13}$ cm$^{-2}$ substrate 35 using the gate electrodes $38D_1$, $38D_2$, $38E_1$, and $38E_2$ as masks and then carrying out heat treatment at 750° C. for 10 minutes for activation.

Figure 12D:
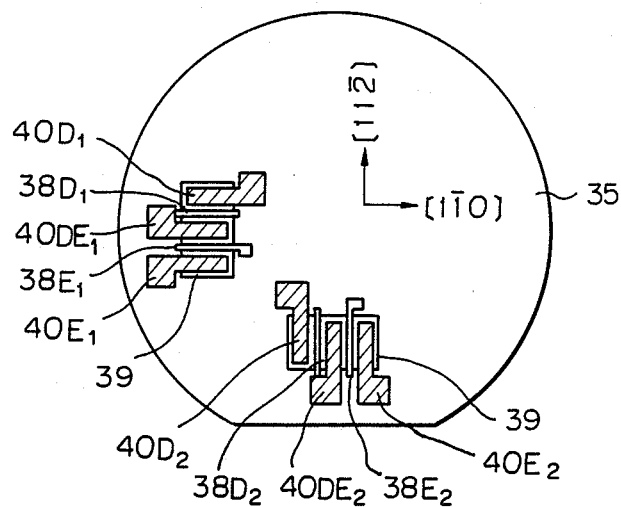

Referring to FIG. 12D, a silicone nitride (SiN$_x$) layer (not shown in the figure) is deposited entirely over the substrate 35 and the gate electrodes $38D_1$ $38D_2$, $39E_1$ and $38E_2$ in a thickness of about 500 nm by, e.g., PCVD. Windows are opened in the SiN$_x$ layer on the n$^+$-type source and drain regions 39 and gold germanium/gold (AuGe/Au) is deposited thereon in a thickness of about 250 nm by evaporation and patterned to form source and drain electrodes $40D_1$, $40DE_1$, $40E_1$, $40D_2$, $40DE_2$, and $40E_2$.

In this inverter device according to the invention, the MESFET's having the gates arranged in directions perpendicular to each other and being of the D mode and E mode have similar gate threshold voltages within some tens of millivolts of difference while the gate length thereof is about 1 μm. These MESFET's can be said to have a uniform gate threshold voltage independent of the directions of the gate thereof.

Also, in a memory device, X- and Y-decoders are made of MESFET's having the same patterns while they have uniform and good characteristics. Thus, various kinds of IC devices can be made according to the invention.

Further, although the above descriptions are made with reference to GaAs MESFET's, the invention may also apply to other compound semiconductors such as InP and InGaAsP or to other kinds of FET's such as a junction FET (JFET), a metal-insulating-semiconductor FET (MISFET), and an FET using two-dimensional carrier gas (HEMT).

We claim:

1. A semiconductor device comprising:
a zincblend type compound semiconductor substrate having a surface of a (111) A plane; and
a plurality of field effect transistors, each including—
source and drain regions in said substrate,
an n-type channel region in said substrate between said source and drain regions,
a gate electrode over the channel region, and
an insulating layer over the substrate;
said gate electrode and said insulating layer positioned to induce tensile stress in said substrate, including said channel region, so that the concentration of n-type majority carriers is reduced.

2. A semiconductor device comprising:
a zincblend type compound semiconductor substrate having a surface of a (111) A plane; and
a plurality of field effect transistors, each including—
source and drain regions in said substate,
an p-type channel region in said substrate between said source and drain regions,
a gate electrode over the channel region, and
an insulating layer over the substrate;
said gate electrode and said insulating layer positioned to induce compressive stress in said substrate, including said channel region, so that the concentation of p-type majority carriers is reduced.

3. A semiconductor device comprising:
a zincblend type compound semiconductor substrate having a surface of a (111) B plane; and
a plurality of field effect transistors, each including—
source and drain regions in said substrate,
an n-type channel region in said substrate between said source and drain regions,
a gate electrode over the channel region, and
an insulating layer over the substrate;
said gate electrode and said insulating layer positioned to induce compressive stress in said substrate, including said channel region, so that the concentration of n-type majority carriers is reduced.

4. A semiconductor device comprising:
a zincblend type compound semiconductor substrate having a surface of a (111) B plane; and
a plurality of field effect transistors, each including—
source and drain regions in said substrate,
an p-type channel region in said substrate between said source and drain regions,
gate electrode over the channel region, and
an insulating layer over the substrate;
said gate electrode and said insulating layer positioned to induce tensile stress in said substrate, including said channel region, so that the concentration of p-type majority carriers is reduced.

5. A semiconductor device comprising:
a zincblend type compound semiconductor substrate having a surface of a (111) A plane;

a first plurality of first field effect transistors including—
  first source and drain regions in said substrate,
  an n-type channel region in said substrate between said first source and drain regions,
  a first gate electrode over the n-type channel region, and
  a first insulating layer over said substrate, said first gate electrode and said first insulating layer positioned to induce tensile stress to a first part of said substrate including said n-type channel region so that the concentration of n-type majority carriers is reduced; and
a plurality of second field effect transducers including—
  second source and drain regions in said substrate,
  a p-type channel region in said substrate between said second source and drain regions,
  a second gate electrode over said p-type channel region, and
  a second insulating layer over said substrate, said second gate electrode and said second insulating layer positioned to induce compressive stress to a second part of said substrate including said p-type channel region so that the concentration of p-type majority carriers is reduced.

6. A semiconductor device comprising:
a zincblend type compound semiconductor substrate having a surface of a (111) B plane;
a first plurality of first field effect transistors including—
  first source and drain regions in said substrate,
  an n-type channel region in said substrate between said first source and drain regions,
  a first gate electrode over the n-type channel region, and
  a first insulating layer over said substrate, said first gate electrode and said first insulating layer positioned to induce compressive stress to a first part of said substrate including said n-type channel region so that the concentration of n-type majority carriers is reduced; and
a plurality of second field effect transducers including—
  second source and drain regions in said substrate,
  a p-type channel region in said substrate between said second source and drain regions,
  a second gate electrode over said p-type channel region, and
  a second insulating layer over said substrate, said second gate electrode and said second insulating layer positioned to induce tensile stress to a second part of said substrate including said p-type channel region so that the concentration of p-type majority carriers is reduced.

7. A device according to claim 1, wherein said insulation layer is of silicon dioxide.

8. A device according to claim 2, wherein said insulating layer is of silicon nitride.

9. A device according to claim 3, wherein said insulating layer is of silicon nitride.

10. A device according to claim 4, wherein said insulating layer is of silicon dioxide.

* * * * *

UNITED STATES PATENT AND TRADEMARK OFFICE
CERTIFICATE OF CORRECTION

PATENT NO.    : 4,777,517
DATED         : October 11, 1988
INVENTOR(S)   : Tsukasa Onodera; Haruo Kawata and Toshiro Futatsugi It is certified that error appears in the above-identified patent and that said Letters Patent is hereby corrected as shown below:

Column 7, Line 20, "$S_iO_3N_4$" should be --$Si_3N_4$--.

Column 9, Line 30, "$cm^{312}$" should be --$cm^{-2}$--.

Signed and Sealed this

Seventh Day of March, 1989

*Attest:*

DONALD J. QUIGG

*Attesting Officer*  *Commissioner of Patents and Trademarks*